United States Patent [19]

Birkle et al.

[11] Patent Number: 4,812,200

[45] Date of Patent: Mar. 14, 1989

[54] METHOD FOR GENERATING RESIST STRUCTURES

[75] Inventors: Siegfried Birkle, Hoechstadt/Aisch; Recai Sezi, Roettenbach; Hans-Dieter Feucht, Erlangen; Rainer Leuschner, Grossenseebach, all of Fed. Rep. of Germany

[73] Assignee: Siemens Aktiengesellschaft, Berlin and Munich, Fed. Rep. of Germany

[21] Appl. No.: 166,436

[22] Filed: Mar. 10, 1988

[30] Foreign Application Priority Data

Mar. 11, 1987 [DE] Fed. Rep. of Germany ....... 3707841

[51] Int. Cl.$^4$ .......................... B44C 1/22; B29C 37/00; C03C 15/00; C03C 25/06
[52] U.S. Cl. ................................. 156/643; 156/659.1; 156/668; 156/904; 427/43.1; 427/54.1; 430/296
[58] Field of Search ............ 156/643, 654, 655, 659.1, 156/668, 904; 427/43.1, 54.1; 430/296

[56] References Cited

U.S. PATENT DOCUMENTS

| 3,125,554 | 3/1964 | Cooper et al. | 260/88.1 |
|---|---|---|---|
| 4,481,049 | 11/1984 | Reichmanis et al. | 156/643 |
| 4,521,274 | 6/1985 | Reichmanis et al. | 156/643 |

FOREIGN PATENT DOCUMENTS 0096596 12/1983 European Pat. Off. .

OTHER PUBLICATIONS

Buiguez et al., "A New Positive Optical Resist for Bilayer Resist Systems", in Heuberger et al., eds. *Microcircuit Engineering* 84, Academic Press, Inc., 1985.

Wilkins, Jr. et al., "An Organosilicon Resin for Multilevel Resist Applications", *J. Vac. Sci. Technol.* B3, 306, (1985).

Saotome et al., "A Silicon Containing Positive Photoresist (SIPR) for a Bilayer Resist", *J. Electrochem. Soc.,* 132, 909, (1985).

*Primary Examiner*—William A. Powell
*Attorney, Agent, or Firm*—Kenyon & Kenyon

[57] ABSTRACT

In generating resist structures according to bilayer technology a series of requirements is made of silicon-containing positive resists. The new method is intended to ensure, inter alia, the profile retention respectively the ability of the resist structures to maintain precise dimensions. According to the invention vinyl phenol-vinyl silane copolymers are used as resist materials.

3 Claims, No Drawings

METHOD FOR GENERATING RESIST STRUCTURES

FIELD OF THE INVENTION

The invention relates to a method for generating resist structures based on silicon-containing positive resists and photoreactive components using UV-radiation.

BACKGROUND

Until relatively recently the so-called three-layer technique had to be employed for photolithographic generation of highly resolved structures (sub micrometer range) on substrates with predetermined topography. This technique is, however, very elaborate and cost-intensive. Moreover, it is also not reproducible to any satisfactory degree, in particular due to the irregular formation of the middle protective layer.

In the meantime, high-resolution silicon-containing positive resists have been developed, which are resistant to reactive ion etching in an oxygen plasma, i.e. have the requisite $O_2$/RIE resistance (RIE=Reactive Ion Etching). With resists of this nature, so-called bilevel resists, the generation of highly resolved structures has now become possible using bilayer technology.

A silicon-containing bilevel resist is known for example from U.S. Pat. No. 4,521,274. This resist is a condensation product of formaldehyde and a phenol substituted with silicon, for example trimethylsilylphenol, which means it is a silicon-containing phenol novolak. The resist can also be in the form of a terpolymer of phenol, trimethylsilylphenol, and formaldehyde (see: *J. Vac. Sci. Technol.*, Vol. B3, 1985, pages 306 to 309).

An Si-containing resist for bilayer resist systems, i.e. for two layer technology is also known from *J. Electrochem. Soc.*, Vol. 132, 1985, pages 909 to 913. This system is a partially trimethylsilylmethylated resorcin formaldehyde resin, i.e. a silicon-containing resorcin novolak.

Silicon-containing positive resists of the above mentioned kind also have the additional advantage that they are soluble in alkaline solutions. This is important for the reason that developing can be carried out in aqueous alkaline solutions, i.e. use of organic developers can be dispensed with. In contrast, positive resists in the form of Si-containing polymethylmethacrylates, as they are known from U.S. Pat. No. 4,481,049 and also resists having substituted silyl residues known from EP Pat. No. 0 096 596 do not have this property.

For bilayer resist systems, further, a positive resist based on silylated polystyrene is known, which has alkylsilyloxy groups (see: A. Heuberger, H. Beneking "Microcircuit Engineering 84", Academic Press Inc., 1985, pages 471 to 481). In addition to its resistance against reactive ion etching in an oxygen plasma, this resist has the property of alkali solubility. Its resolution capability, however, does not meet the demands made of it and the contrast (for UV light) is relatively low, specifically, it is less than 2.

The known Si-containing positive resists, which are sensitive to high-energy radiation, however, do not have all of the required properties. In addition to resistance against reactive ion etching in an oxygen plasma, high resolution capability, and alkali solubility, above all high softening temperature is required. A high softening temperature is important for retaining the profile or the exact size-retaining ability of the resist structures, and in particular during the drying process, as well as during etching in an oxygen plasma, because in the process, the substrate, for example a wafer, is heated. With low softening temperatures, as is the case with the known resists, rounding off of the resist edges occurs at relatively low temperatures.

It is an object of the invention to develop a method of the foregoing kind in such manner that the profile retention or ability to retain exact size of the resist structures is ensured. Other objects include development of a resist material that has resistance against reactive ion etching in an oxygen plasma, high resolution capability, alkali solubility and a high softening temperature.

SUMMARY OF THE INVENTION

These and other objects are achieved by the present invention which is directed to a method for generating a resist structure based upon a silicon-containing positive resist material. This resist material is made of vinyl phenol-vinyl silane copolymers having the following formula I:

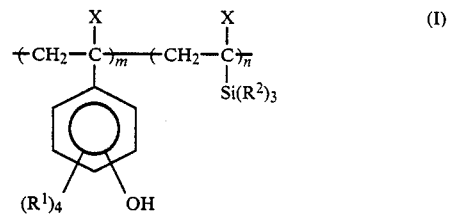

in which
$m+n=1$ and n is maximally 0.55,
and for the residues:
X=H, $CH_3$, $C_2H_5$, or halogen (i.e. F, Cl, Br, I),
$R^1$=H, $CH_3$, $C_2H_5$, or halogen,
$R^2$=H, $CH_3$, $C_2H_5$, $C_3H_7$, or $C_6H_5$,
and where the residues X, $R^1$, and $R^2$ can be identical or different in each instance.

In formula I, m and n indicate the composition of the copolymers as amount of substance (mol fraction). The proportion of the component n, that is of the vinyl silane basic building block, here is approximately 0.55 at a maximum.

DETAILED DESCRIPTION OF THE INVENTION

The resist materials used in the method according to the invention have a high softening temperature, specifically, it is higher than 155° C. These resist materials, further, are alkaline soluble, i.e. in their application, commercially available aqueous developers can be used. Moreover, the resist materials have high etching resistance in an oxygen plasma and also have a high resolution. Together with photoreactive components the resist materials yield positive resists, which are UV-radiation sensitive. It is important in this connection that very good sensitivity to normal UV-radiation (NUV, i.e. approximately 330 to 440 nm) as well as to short-wave, i.e. Deep UV-radiation (DUV, i.e. <300 nm) is given. The (high) sensitivity to NUV (Near UV) is of significance for the reason that then the available exposure devices can be used, i.e. for the structure generation no additional investments are required. The contrast for UV-radiation is very high, it is approximately 6.

Apart from the foregoing properties, the resist material used in the method according to the invention has the additional advantage of reproducible manufacture and high storability. Further, this material has a narrow molecular weight distribution, $M_W/M_n$ is about 1.2 specifically. For the remainder, the vinyl phenol-vinyl silane copolymer used as resist material in the method according to the invention has a molecular weight approximately between 500 and 50,000; preferentially the molecular weight lies in the range approximately between 1000 and 5000.

The resist material according to the invention can not only be used for bilevel RIE technology, but it can also serve as a monolayer. The silicon proportion of this material is variable within a relatively broad range. When used as bilevel resist the molar ratio of the two copolymer basic building blocks, vinyl phenol and vinyl silane, is between 85:15 and 45:55, i.e. the resist material has at least 15 mol percent and a maximum of 55 mol percent of the vinyl silane component. At a lower content of silicon, on the one hand, the $O_2$/RIE resistance would be too low, while at a higher level, on the other hand, development in an aqueous alkaline medium would no longer be possible. The content of the vinyl silane component preferentially is approximately between 30 and 50 mol percent when using the copolymer as bilevel resist.

In the method according to the invention copolymers of vinyl phenol and vinyl trimethylsilane preferentially are used as resist material. To the resist material a photoreactive component is added. Preferred is a quinone diazide such as naphthoquinone diazide; that is, a quinoid diazocarbonyl compound.

Quinone diazides to be considered are conversion products of the following compounds

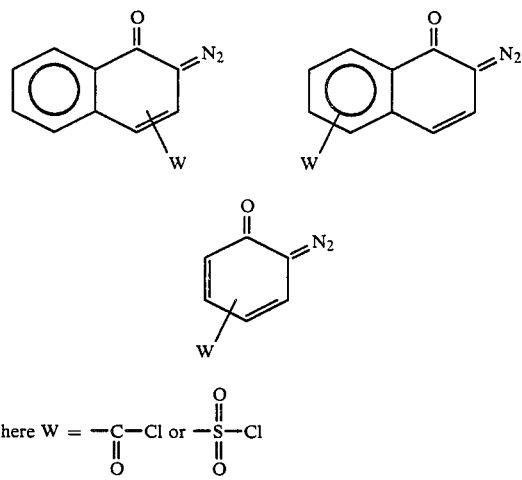

where $W = -\overset{O}{\underset{O}{\|}}{-C-Cl}$ or $-\overset{O}{\underset{O}{\|}}{-S-Cl}$ with aromatic or aliphatic active hydrogen compounds such as alcohols, phenols, and amines. An especially suitable photoreactive component is the 4 or 5 sulphonic acid ester of naphthoquinone diazide with polyvalent phenols such as 2,3,4-trihydroxybenzophenone and bisphenol A.

Preparation of the copolymers used in the method according to the invention as resist materials takes place using the corresponding phenol ethers (OR* instead of OH in formula I). These phenol ethers are split using suitable Lewis acids. Ether splitting as well as the preparation of the phenol ether copolymers is described in the simultaneously filed U.S. patent application corresponding to German Application No. P 3707843.7 and entitled, "Alkenylphenol and Alkenylphenol Ether Copolymers".

The invention will be described in greater detail in conjunction with examples.

EXAMPLE 1

By mixing 1 part by weight of an ester, prepared from 1 mol 2,3,4-trihydroxybenzophenone and 3 mol 6-diazo-5-oxo-5,6-dihydro-naphthalenesulphonyl chloride (prepared according to U.S. Pat. No. 3,148,983), 3 parts by weight of a copolymer consisting of 60 mol percent p-vinyl phenol and 40 mol percent vinyl trimethylsilane (molecular weight: approximately 2500), and 16 parts by weight of cyclohexanone a photoresist solution is prepared. The prepared solution is filtered through a 0.2 μm filter and projected onto a 4 inch silicon wafer (duration: 25 seconds); at 3000 rpm a coat thickness of 0.9 μm is obtained. Subsequently drying takes place at 90° C. for 30 minutes in a forced-air oven. Following drying, exposure with a mercury discharge lamp (type OSRAM HBO 350 W) for 3 seconds through a contact mask is carried out and subsequently developing for 45 seconds with a commercially available alkaline developer ("Microposit Developer 303" by Shipley, diluted with the four-fold volume of distilled water). In the process structures in the submicrometer range are obtained, the ability of which to maintain precise dimensions is not impaired during after-drying at 140° C./30 minutes.

EXAMPLE 2

By mixing 1 part by weight of an ester, prepared from 1 mol 2,3,4-trihydroxybenzophenone and 2 mol 6-diazo-5-oxo-5,6-dihydro-naphthalenesulphonyl chloride (see example 1), 3 parts by weight of a vinyl phenol-vinyl trimethylsilane copolymer corresponding to example 1, and 16 parts by weight of 2-ethoxyethylacetate a photoresist solution is prepared. The prepared solution is filtered through a 0.2 μm filter and projected onto a 4 inch silicon wafer (duration: 25 seconds); at 2000 rpm a coat thickness of 0.6 μm is obtained. Subsequently, drying takes place for 30 minutes at a temperature of 90° C. in the forced-air oven. Following drying, exposure for 2 seconds with a mercury discharge lamp (type OSRAM HBO 350 W) through a contact mask takes place, and subsequently developing for 45 seconds with a commercially available alkaline developer ("Microposit Developer 303", diluted with the two-fold volume of distilled water). In the process structures in the submicrometer range are obtained, which, during the following after-drying at 140° C./30 minutes, do not suffer impairment with respect to their ability to maintain exact dimensions.

EXAMPLE 3

By mixing 1 part by weight of an ester, prepared from 1 mol bisphenol A and 2 mol 6-diazo-5-oxo-5,6-dihydro-naphthalenesulphonyl chloride, 2 parts by weight of a vinyl phenol-vinyl trimethylsilane copolymer corresponding to example 1, and 12 parts by weight of cyclohexanone, a photoresist solution is prepared. The prepared solution is filtered through a 0.2 μm filter and projected onto a 4 inch silicon wafer (duration: 25 seconds); at 3000 rpm a coat thickness of 0.9 μm is obtained. Subsequently, in the forced-air oven drying takes place for 30 minutes at a temperature of 90° C. Exposure takes place subsequently with a mercury discharge lamp (type OSRAM HBO 350 W) for 10 seconds through a contact mask and following it developing for 180 seconds with a commercially available alkaline developer ("OFPR Developer NMD-3" by Dynachem). The process yields structures in the submicrometer range, which do not suffer impairment with respect to their ability to maintain precise dimensions during the following after-drying at 140° C./30 minutes.

EXAMPLE 4

Onto a 4 inch silicon wafer a commercially available NUV positive resist based on novolak/quinone diazide ("Microposit 1450 J" by Shipley) is projected at 3000 rpm (duration: 25 seconds), drying takes place subsequently for 30 minutes at 90° C. and following the drying, heating at 250° C. in the forced-air oven for 30 minutes. After heating the coat thickness of the resist serving as bottom resist is 2.2 μm.

Now a resist solution corresponding to example 1 is projected at 3000 rpm onto the bottom resist (duration: 25 seconds) and dried in the forced-air oven for 30 minutes at 90° C. In the process of this drying, a 0.9 μm thick top resist is obtained, which adheres well to the bottom resist. The overall thickness of the two-layer resist is 3.1 μm.

The top resist is then exposed with a mercury discharge lamp (type OSRAM HBO 350 W) for 6 seconds through a contact mask and subsequently developed for 45 seconds with the developer corresponding to example 1. In the top resist good structures are obtained in the submicrometer range. During after-drying at 140° C./30 minutes these structures indicate no impairment of the ability to maintain precise dimensions.

The structures generated in the top resist are subsequently transferred through reactive ion etching in an oxygen plasma (with reactor AME 8111 by Applied Materials, Inc.), gas pressure: 0.7 Pa, flow velocity: 35 sccm/min, power density: 0.2 W/cm$^2$, to the bottom resist; the top resist functions as mask in this step of the procedure. Structure transfer takes place with steep edges.

We claim:

1. A method for generating a resist structure through the use of a silicon-containing positive resist, and a photoreactive component, in combination with masking and irradiating with UV-radiation, comprising:

applying a resist material of a vinyl phenolvinyl silane copolymer having formula I

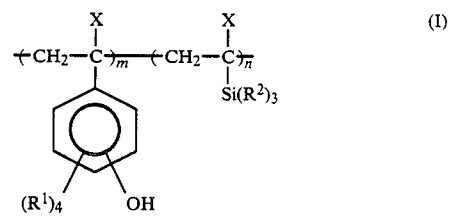

wherein
m+n is 1 and n is maximally 0.55;
X is H, CH$_3$, C$_2$H$_5$, or halogen;
R$^1$ is H, CH$_3$, C$_2$H$_5$, or halogen;
R$^2$ is H, CH$_3$, C$_2$H$_5$, C$_3$H$_7$, or C$_6$H$_5$;
said X, R$^1$, and R$^2$ being identical or different.

2. A method according to claim 1, wherein the resist material is a copolymer of vinyl phenol and vinyl trimethylsilane.

3. A method according to claim 1 or 2, further comprising adding a quinone diazide to the resist material as photoreactive component.

* * * * *